(12) United States Patent
Cioaca

(10) Patent No.: US 6,687,165 B1
(45) Date of Patent: Feb. 3, 2004

(54) TEMPERATURE-COMPENSATED OUTPUT BUFFER CIRCUIT

(75) Inventor: Dumitru Cioaca, Cupertino, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/329,839

(22) Filed: Dec. 26, 2002

(51) Int. Cl.⁷ .................. G11C 7/00; H03L 7/08
(52) U.S. Cl. .................. 365/189.05; 365/189.09; 365/211; 327/158
(58) Field of Search .............. 365/189.05, 189.09, 365/211; 327/158

(56) References Cited

U.S. PATENT DOCUMENTS

| | | | |
|---|---|---|---|
| 4,760,292 A | | 7/1988 | Bach |
| 4,897,613 A | | 1/1990 | Rao et al. |
| 4,978,905 A | | 12/1990 | Hoff et al. |
| 5,066,873 A | | 11/1991 | Chan et al. |
| 5,120,992 A | * | 6/1992 | Miller et al. ............. 327/111 |
| 5,796,313 A | * | 8/1998 | Eitan ...................... 331/57 |
| 6,040,729 A | | 3/2000 | Sanchez et al. |
| 6,225,844 B1 | * | 5/2001 | Fujiwara .................. 327/170 |
| 6,297,685 B1 | | 10/2001 | Ewen et al. |
| 2003/0058732 A1 | | 3/2003 | Nam |

* cited by examiner

*Primary Examiner*—Vu A. Le
(74) *Attorney, Agent, or Firm*—Leffert Jay & Polglaze, P.A.

(57) ABSTRACT

An output buffer circuit that compensates for ambient temperature changes facilitates more consistent current drive capacity across a range of ambient temperatures. The number of output buffer stages utilized to generate the data output signal is varied in response to changes in ambient temperature.

44 Claims, 10 Drawing Sheets

TEMPERATURE-COMPENSATED OUTPUT BUFFER CIRCUIT

TECHNICAL FIELD OF THE INVENTION

The present invention relates generally to buffer circuits and more particularly, to buffer circuits that compensate for ambient temperature changes.

BACKGROUND OF THE INVENTION

Integrated circuits are common in electronic products. Electronic products often are comprised of integrated circuits interfaced to each other via a data bus or other data paths. Interface specifications for various digital logic families delineate voltage and current levels required for digital signals to be transferred between two or more integrated circuits. Interface specifications are utilized by integrated circuits through the use of output buffer circuits to drive a logical low or logical high signal across a data path. In addition, output buffer circuits are a way of interfacing different digital logic families of integrated circuits.

Typically, output buffer circuits often use an external voltage level, Vcc, as a source of the logic high level. Depending on the design, Vcc can range from 3.0 to 5.5 volts. Output buffer circuits generally use a system ground (GND) as a sink for a logic low output. Output buffer circuits generally use two complementary transistor devices. The first device is a pchannel pull-up metal-oxide semiconductor (MOS) transistor, whose source is connected to Vcc, and whose drain is connected to the output terminal. The second device is an nchannel pull-down MOS transistor, whose drain is connected to the output terminal, and whose source is connected to ground.

Generally, a MOS device, when the drain source voltage is greater than or equal to the difference between the threshold voltage and the gate source voltage, is in the saturation region and acts like a constant current source. The MOS device is in the linear region and acts like a resistor when the drain source voltage is less than the difference between the threshold voltage and the gate source voltage.

Using the MOS device switching characteristics, an input data signal controls each device at its gate via control logic. To output a logic high signal, the first pull-up device is turned on by the control logic, and the first pull-down device is turned off. Output switching to this high state allows current to flow from Vcc to the output terminal via the first device and provides for a high impedance state via the second device so that no output signal current may flow through it to GND. In order to output a logic low signal, the first pull-up device is turned off, thus providing for a high impedance state between Vcc and the output terminal. In this low state, no current will flow from Vcc to the output terminal. Concurrently, the first pull-down device is turned on, thus allowing current to pass from the output terminal to GND. Thus, the output buffer circuit acts as a sink for current, and the output signal is a logic low signal. Therefore, the transition of the signal at the output terminal from one state to another state requires switching one of the devices on while switching the other device off. The gates of the first pull up and first pull down device are typically coupled to receive a data signal having a logic level adapted to activate one of the devices and to deactivate the other.

One example of an application of an output buffer is in a memory system. A memory system is commonly used in products such as digital cameras, personal digital assistants, and video game systems. A typical memory system is used to store commands or data that will be used in conjunction with a microprocessor. With the development of faster and faster microprocessors, memory systems must also keep pace. Fast transition times are a factor in the design of increasing circuit speed. This is particularly true with respect to memory systems. However, the fast transition times are affected by ambient temperature. In semiconductor devices, it is common for the output buffer stages to diminish in current drive capacity in response to increases in temperature. Such reductions in current drive capacity can translate into reduced operating speeds as signal transitions in the output signals will be slower. Therefore, the output buffer circuit is slower and thus, system speed is slower as well.

For the reasons stated above, and for other reasons stated below which will become apparent to those skilled in the art upon reading and understanding the present specification, there is a need in the art for alternative output buffer circuits and methods of their operation.

SUMMARY OF THE INVENTION

Various embodiments of the invention include apparatus and methods for providing increased drive capacity of an output buffer in response to changes in ambient temperature. This increased drive capacity is accomplished by selectively activating additional output buffer stages in response to increases in ambient temperature, and thus, increasing the current drive capacity of the output buffer.

For one embodiment, the invention provides an output buffer circuit. The output buffer circuit includes a first output buffer stage for providing an output signal indicative of a logic of a data signal and at least one second output buffer stage. Each second output buffer stage is adapted to selectively generate, in response to a temperature-dependent control signal, an output signal indicative of the logic of the data signal in parallel with the output signal of the first output buffer stage.

For another embodiment, the invention provides an output buffer circuit. The output buffer circuit includes an output driver for providing two control signals representative of a data signal, a first output buffer stage for providing an output signal indicative of the data signal in response to the two output driver control signals, at least one switch responsive to a temperature-dependent control signal and at least one second output buffer stage in parallel with the first output buffer stage. Each switch is adapted to pass the two output driver control signals when the temperature-dependent control signal has a first logic value and to pass two complementary control signals when the temperature-dependent control signal has a second logic value. Each second output buffer stage coupled to one of the switches in a one-to-one relationship for receiving its output control signals. Each second output buffer stage is adapted to provide an output signal indicative of the data signal when the temperature-dependent control signal has the first logic value and to present a high-impedance state when the temperature-dependent control signal has the second logic value.

For yet another embodiment, the invention provides a method of providing a data output signal. The method includes generating a first output signal at a first output buffer stage in response to a data signal, selectively activating a second output buffer stage to generate a second output signal in response to the data signal when an ambient temperature is greater than or equal to a predetermined threshold and adding the first output signal and the second output signal to generate the data output signal. The invention further provides apparatus and methods of varying scope.

DETAILED DESCRIPTION OF THE INVENTION

In the following detailed description of the present embodiments, reference is made to the accompanying drawings that form a part hereof, and in which is shown by way of illustration specific embodiments in which the invention may be practiced. These embodiments are described in sufficient detail to enable those skilled in the art to practice the invention, and it is to be understood that other embodiments may be utilized and that process, electrical or mechanical changes may be made without departing from the scope of the present invention. The following detailed description is, therefore, not to be taken in a limiting sense, and the scope of the present invention is defined only by the appended claims and equivalents thereof.

Figure 1A:
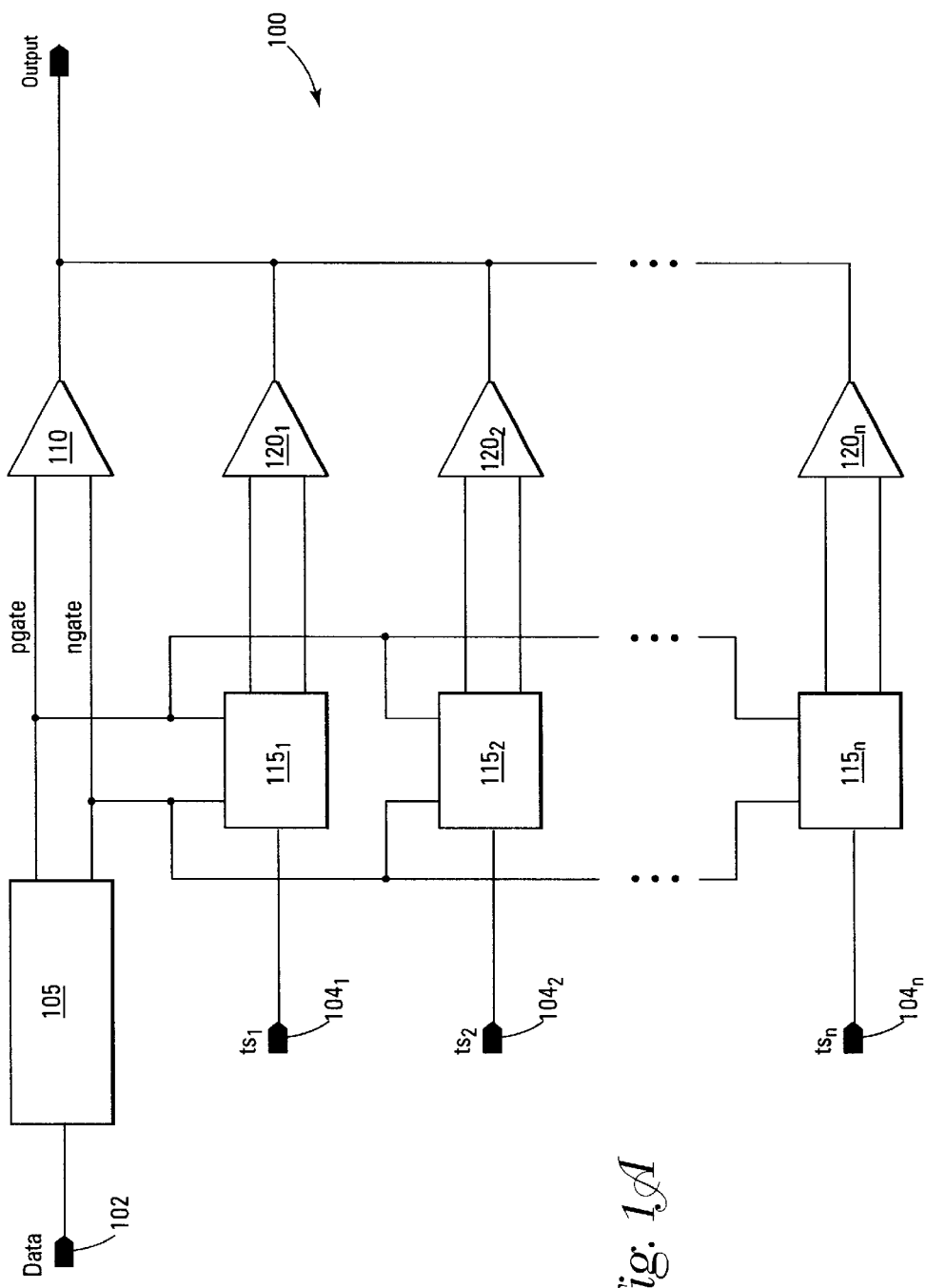
FIG. 1A is a block diagram of a temperature compensated output buffer circuit in accordance with an embodiment of the invention.

FIG. 1A is a block diagram of an output buffer circuit 100 in accordance with an embodiment of the invention. The output buffer circuit 100 includes an output driver 105 for receiving a signal indicative of a data value, i.e., data signal 102, and providing one or more control signals, e.g., ngate and pgate, for driving a first output buffer stage 110. In response to the control signals ngate and pgate, the first output buffer stage 110 generates an output signal 112. The output signal 112 of the first output buffer stage 110 is provided to the output 130 of the output buffer circuit 100.

Figure 1B:
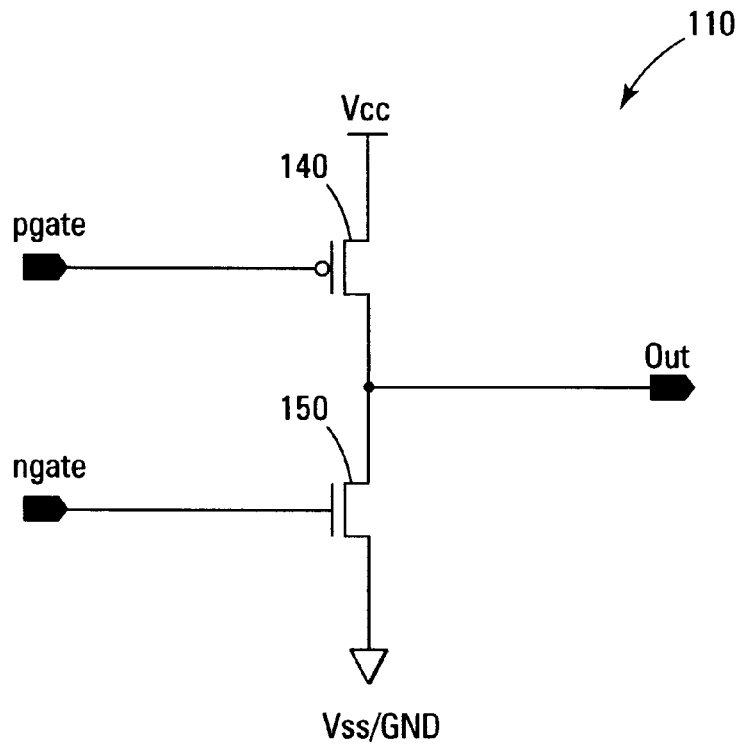
FIG. 1B is a schematic of an exemplary output buffer stage for use with the output buffer circuit of FIG. 1A.

A typical first buffer stage, as shown in FIG. 1B, is formed of a p-channel field-effect transistor (pFET) 140, or pull-up transistor, and an n-channel field-effect transistor (nFET) 150, or pull-down transistor, having their drains coupled together as an output of the buffer stage and having their sources coupled to receive, respectively, a first potential representing a first logic level, e.g., Vcc, and a second potential representing a second logic level, e.g., Vss or ground. The gates of the pFET and the nFET are typically coupled to receive a control signal having a logic level adapted to activate one of the FETs and to deactivate the other. While the same control signal may be applied to each gate, it is common to use separate control signals for each gate, e.g., ngate and pgate. This permits incorporating delay into the control signals to avoid a situation where both transistors may be activated at the same time. Use of separate control signals, such as ngate and pgate in the current example, further permits such output buffer stages to be placed in a high-impedance state, or tri-stated, by applying complementary signals to both gates to cause deactivation of both FETs.

The output driver 105 is typically used to generate the separate control signals ngate and pgate such that each control signal has a relatively quick transition from an on state to an off state and a relatively slow transition from an off state to an on state. This helps to ensure that an output buffer stage receiving the two control signals will avoid having both the pull-up transistor and the pull-down transistor active at the same time. That is, by controlling the transitions of the two control signals ngate and pgate, the output buffer stages will, during normal operation, transition to a high-impedance state prior to changing the logic level of its output. However, for one embodiment, the data signal 102 is provided directly to the output buffer stage 110, thus becoming both the ngate signal and the pgate signal to the output buffer stage 110.

As ambient temperature rises, the current drive of an output buffer stage generally declines. To compensate for such capacity reductions, various embodiments of the invention include one or more second output buffer stages 120 that may be selectively activated in parallel with the first output buffer stage 110. Coupling second output buffer stages 120 in parallel with the first output buffer stage increases the current drive of the output buffer circuit 100. By intelligently coupling these additional buffer stages in response to increases in ambient temperature, the drive, and thus the speed, of the output buffer circuit 100 may be maintained across a wider range of temperatures than the first output buffer stage 110 could effect on its own.

The second output buffer stages 120 are adapted to selectively receive the control signals ngate and pgate in response to a temperature-dependent control signal 104. For one embodiment, each second output buffer stage 120 is adapted to receive a separate temperature-dependent control signal 104. In this manner, differing numbers of second buffer stages 120 may be activated as the ambient temperature crosses multiple predetermined thresholds. For one embodiment, a switch 115, responsive to its temperature-dependent control signal 104, is coupled between each second output buffer stage 120 and its input control signals ngate and pgate. If the temperature-dependent control signal 104 is indicative of a desire to activate its second output buffer stage 120, the control signals ngate and pgate will be passed to its second output buffer stage 120. Deactivated second output buffer stages 120 should be placed in a high-impedance state when not receiving the data signal 102. As mentioned with respect to the typical configuration of an output buffer stage, this may be accomplished by placing complementary signals on each of the gates of the FETs, e.g., a logic low value on the gate of the nFET device and a logic high value on the gate of the pFET device. Placing deactivated second output buffer stages 120 in a high-impedance state is preferred in order to avoid corruption of the signal at the output 130 of the output buffer circuit 100.

Figure 2:
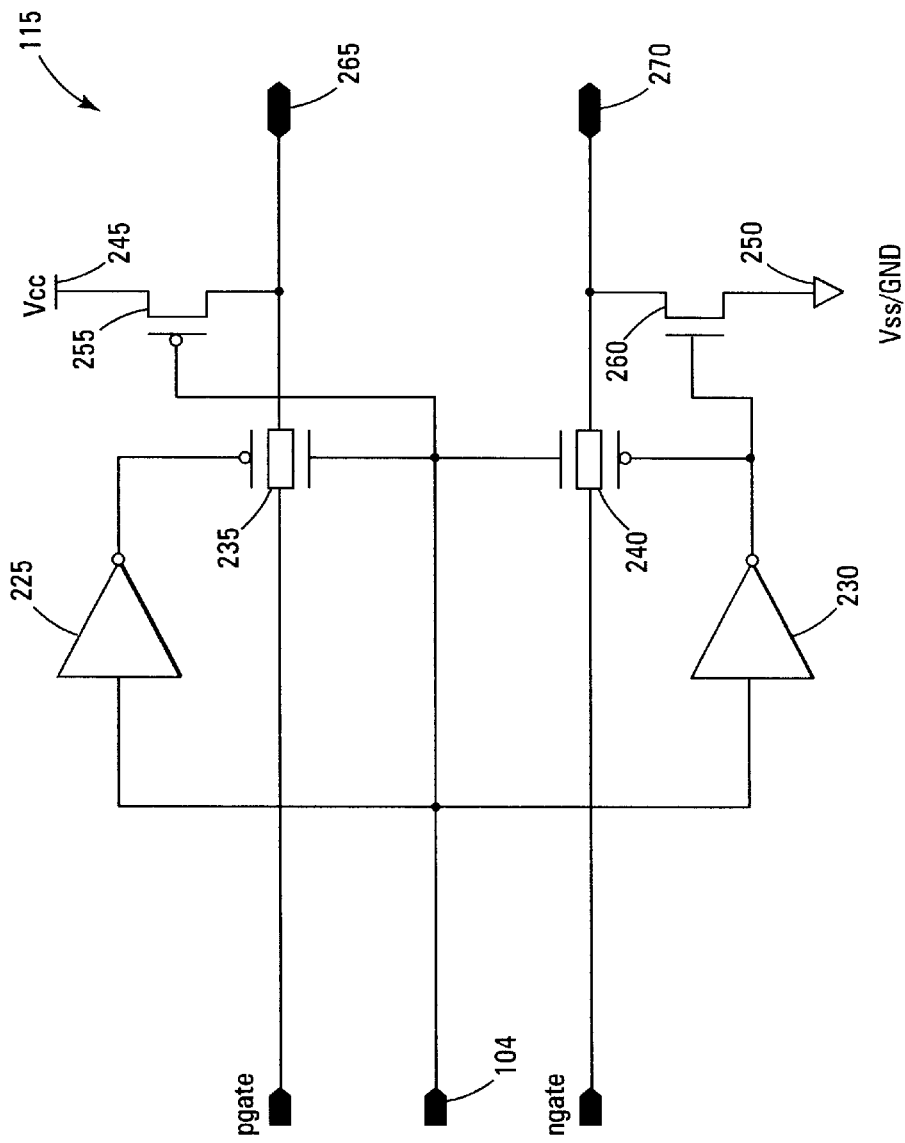
FIG. 2 is a schematic of a switch for use with the output buffer circuit of FIG. 1A.

FIG. 2 is a circuit diagram of a switch 115 in accordance with one embodiment of the invention. The pgate control signal is selectively passed through a transfer gate 235 to node 265. The node 265, referring to the example output buffer stage 110 of FIG. 1B, would be coupled to the gate of the pFET 140. The ngate control signal is selectively passed through a transfer gate 240 to node 270. The node 270, referring to the example output buffer stage 110 of FIG. 1B, would be coupled to the gate of the nFET 150. The transfer gates 235 and 240 are each selectively activated in response to a temperature-dependent control signal 104.

For the embodiment depicted in FIG. 2, the temperature-dependent control signal 104 is provided to an nFET side of each transfer gate 235/240. The temperature-dependent control signal 104 is inverted by an inverter 225 prior to being provided to a pFET side of the transfer gate 235 and inverted by an inverter 230 prior to being provided to a pFET side of the transfer gate 240. In this manner, when the temperature-dependent control signal 104 has a logic low level, the control signals ngate and pgate are blocked by the transfer gates 240 and 235, respectively.

The switch 115 of FIG. 1A further depicts circuitry to place the output buffer stages 120 in a high-impedance state when the transfer gates 235 and 240 are deactivated. The temperature-dependent control signal 104 is provided to the gate of a pFET 255. In its logic low state, the temperature-dependent control signal 104 will activate the pFET 255 to couple the node 265 to a potential node 245, such as Vcc, for providing a logic high signal to the pull-up device of its associated output buffer stage 120. The temperature-dependent control signal 104 is, after inverting by the inverter 230, also provided to the gate of an nFET 260. In its logic low state, the temperature-dependent control signal 104 will, after inversion, activate the nFET 260 to couple the node 270 to a potential node 250, such as Vss or GND, for providing a logic low signal to the pull-down device of its associated output buffer stage 120. In this manner, the associated output buffer stage 120 is placed in a high-impedance state in response to a logic low temperature-dependent control signal 104 while the control signals ngate and pgate are blocked.

Figure 3:
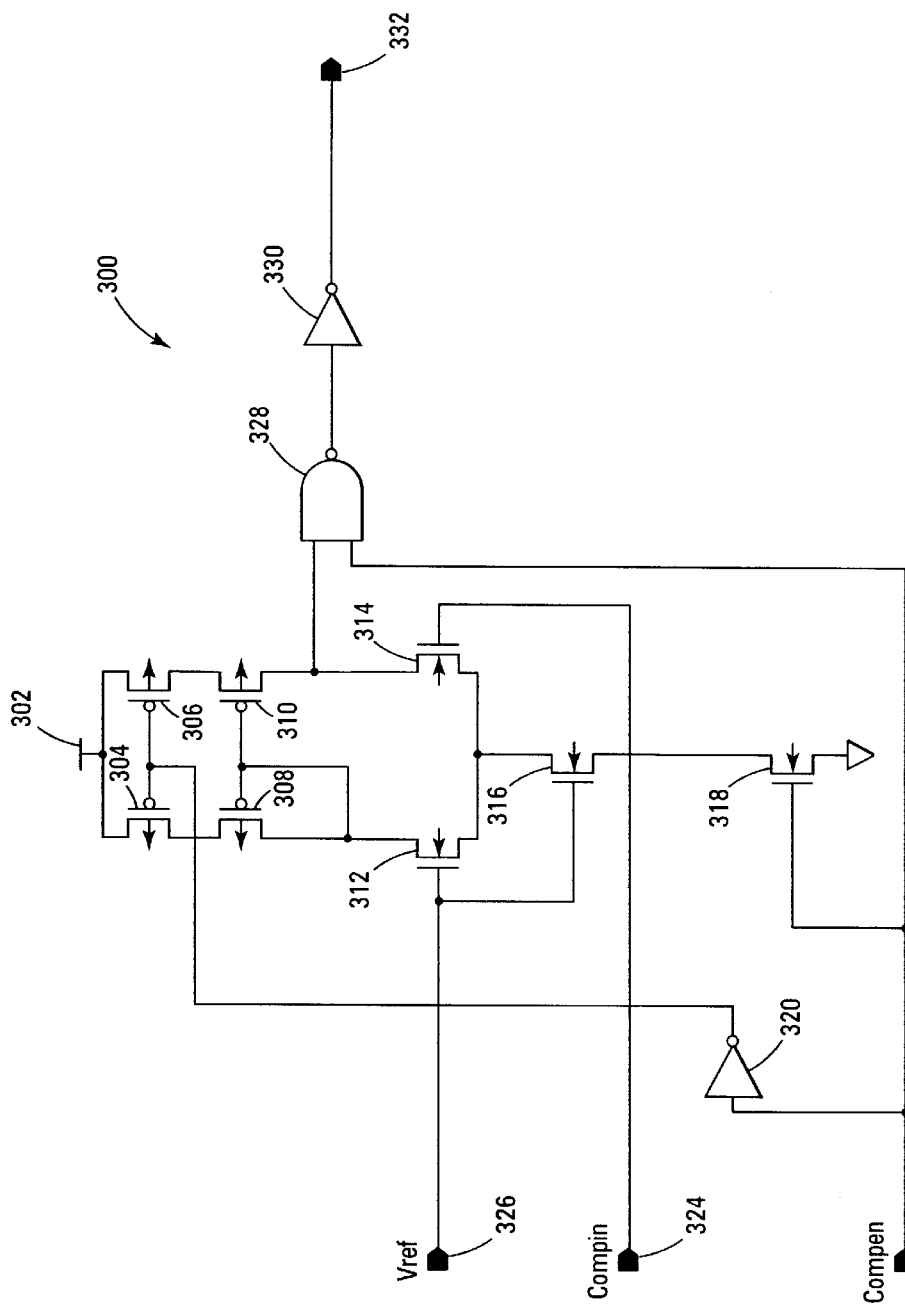
FIG. 3 is a schematic of a comparator with the temperature sensitive voltage generator circuitry.

The temperature-dependent control signal 104 is preferably generated in response to a comparison of a temperature-dependent voltage signal with a first reference voltage signal. FIG. 3 is a schematic of a comparator 300 in accordance with an embodiment of the invention. The comparator 300 is enabled by a comparator enable signal, compen, provided at node 322. This signal is inverted by inverter 320 and provided to the gates of pFETs 304 and 306. The pFETs 304 and 306 each have their sources coupled to receive a supply potential, e.g., Vcc, at node 302. A pFET 308 has its source coupled to the drain of the pFET 304 and its gate coupled to its drain. An nFET 312 has its drain coupled to the drain of the pFET 308 and its gate coupled to receive a first reference voltage, Vref, at node 326. An nFET 316 has its gate coupled to the gate of the nFET 312 and its drain coupled to the source of the nFET 312. An nFET 318 has its drain coupled to the source of the nFET 316, its gate coupled to receive the comparator enable signal and its source coupled to receive a ground potential.

A pFET 310 has its gate coupled to the gate of the pFET 308 and its source coupled to the drain of the pFET 306. An nFET 314 has its drain coupled to the drain of the pFET 310 and its gate coupled to receive a comparator input signal, compin, at node 324. The source of pFET 314 is coupled to the drain of nFET 316 and the source of nFET 312. The comparator input signal is a temperature-dependent voltage signal.

A NAND gate 328 has a first input coupled to the drain of the pFET 310 and a second input coupled to receive the comparator enable signal. The output of the NAND gate 328 is inverted by inverter 330, typically for signal conditioning and buffering, and provided to the output 332 of the comparator 300. The output of the comparator is the temperature-dependent control signal 104 for use in FIG. 2.

For one embodiment, the first reference voltage Vref is approximately 2V. The first reference voltage Vref is preferably an internally generated voltage, e.g., produced by a bandgap reference voltage generator. This permits the first reference voltage to remain relatively constant across a range of supply potentials provided to the integrated circuit. A constant first reference voltage permits a more consistent response to changes in ambient temperature. The comparator 300 is enabled by applying a logic high signal to node 322. As the comparator input signal at node 324 approaches the first reference voltage from below, the output of the comparator 300 will have a logic low value. As the comparator input signal at node 324 reaches and exceeds the first reference voltage applied to node 326, the output of the comparator 300 will transition to a logic low value.

The comparator input signal at node 324 of the comparator 300 should be proportional to the ambient temperature. The relationship can be any function that has a unique relationship between an ambient temperature value and a signal level. For example, the relationship might be a direct proportionality, an inverse proportionality or a second-order exponential proportionality. FIGS. 4A–4D are schematics of various temperature-dependent voltage generators 400 in accordance with embodiments of the invention.

Figure 4A:
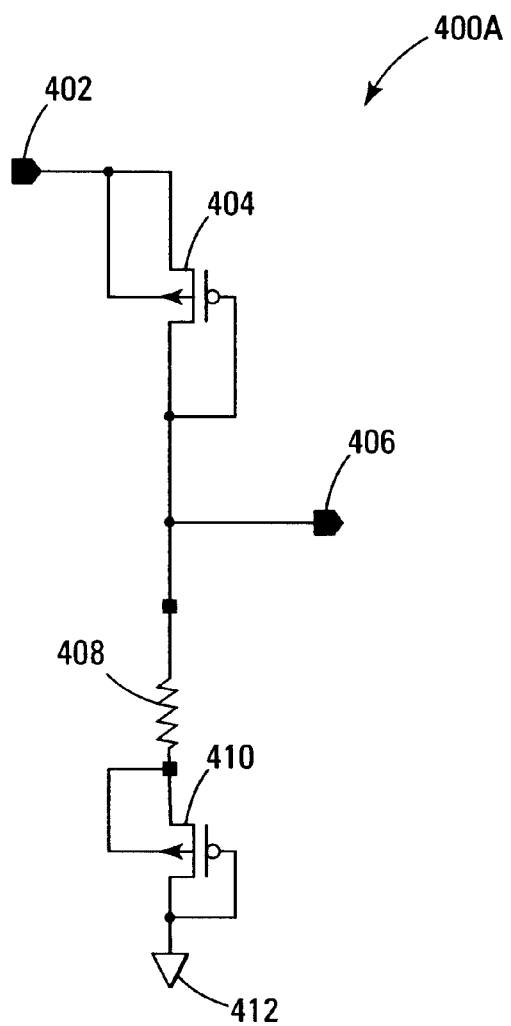
FIG. 4A is a schematic of a temperature-dependent voltage generator in accordance with one embodiment of the invention.

FIG. 4A is a schematic of a temperature-dependent voltage generator 400A. The temperature-dependent voltage generator 400A is coupled to receive a second reference voltage at node 402. For one embodiment, the second reference voltage at node 402 has a value greater than the first reference voltage applied to the comparator 300. For example, the second reference voltage at node 402 may have a value of approximately 5V while the first reference voltage applied to the comparator 300 may have a value of approximately 2V. As with the first reference voltage applied to the comparator 300, the second reference voltage at node 402 is preferably an internally-generated voltage to improve consistency of the response to ambient temperatures across a variety of supply voltages. However, the various embodiments can operate using externally-applied voltages.

The temperature-dependent voltage generator 400A further includes a pFET 404 having its source and body coupled to the node 402 and its gate coupled to its drain. An output node 406 is coupled to the drain of the pFET 404 for providing the comparator input signal. A resistive element 408, such as a polysilicon resistor, is coupled between the drain of the pFET 404 and the source of a pFET 420. The pFET 410 has its body coupled to its source and its gate coupled to its drain. The drain of the pFET 410 is further coupled to a ground node 412. The resistive element 408 is generally a temperature-insensitive element while the pFETs 404 and 410 are generally temperature-sensitive elements. Table 1 provides an example of the temperature-dependent voltage signal generated at the output node 406 when the pFET 404 has a ratio of 4/10, the pFET 410 has a W/L of 100/4 and the resistive element 408 is a n-type polysilicon resistor having a W/L ratio of 2/60000. The second referance-voltage applied to node 402 is approximately 5V.

TABLE 1

Voltage Output of an Example Temperature-Sensitive Voltage Generator

| Ambient Temperature (° C.) | Output Voltage (V) |
|---|---|
| −50 | 2.165 |
| −25 | 2.105 |
| 0 | 2.054 |
| 25 | 2.002 |
| 50 | 1.956 |
| 75 | 1.915 |
| 100 | 1.868 |

By comparing the temperature-dependent voltage signal of the function shown in the example of Table 1, the output signal of the comparator 300 would transition from a logic low value to a logic high value at approximately 25° C. This transition point can be moved to some other predetermined value by adjusting values of the resistive element 408 and the pFETs 404 and 410, or by adjusting the first reference voltage value applied to the comparator 300 at node 326. However, to permit use of a signal first reference voltage across a number of comparators 300, it is preferred that the output of the temperature-dependent voltage generators 400 be adjusted.

Figure 4B:
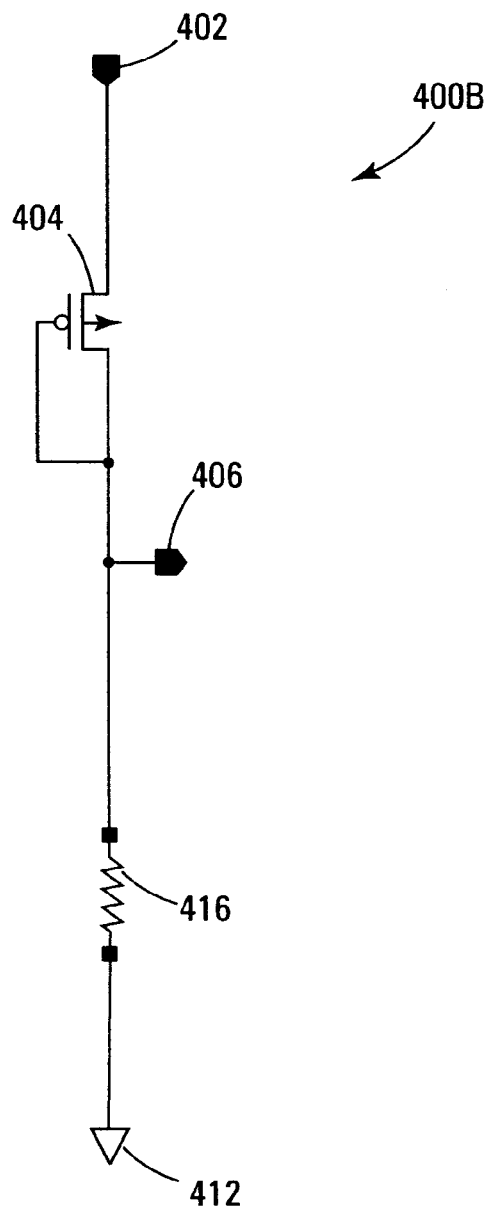
FIG. 4B is a schematic of a temperature-dependent voltage generator in accordance with another embodiment of the invention.

FIG. 4B is a schematic of a temperature-dependent voltage generator 400B in accordance with another embodiment of the invention exhibiting an inverse proportionality between the ambient temperature and its output. The temperature-dependent voltage generator 400B is coupled to receive the second reference voltage at node 402. A pFET 414 is coupled in series with a resistive element 416 between the node 402 and a ground node 412. The pFET 414 has its gate coupled to its drain. The output node 406 is coupled to the drain of the pFET 414.

Figure 4C:
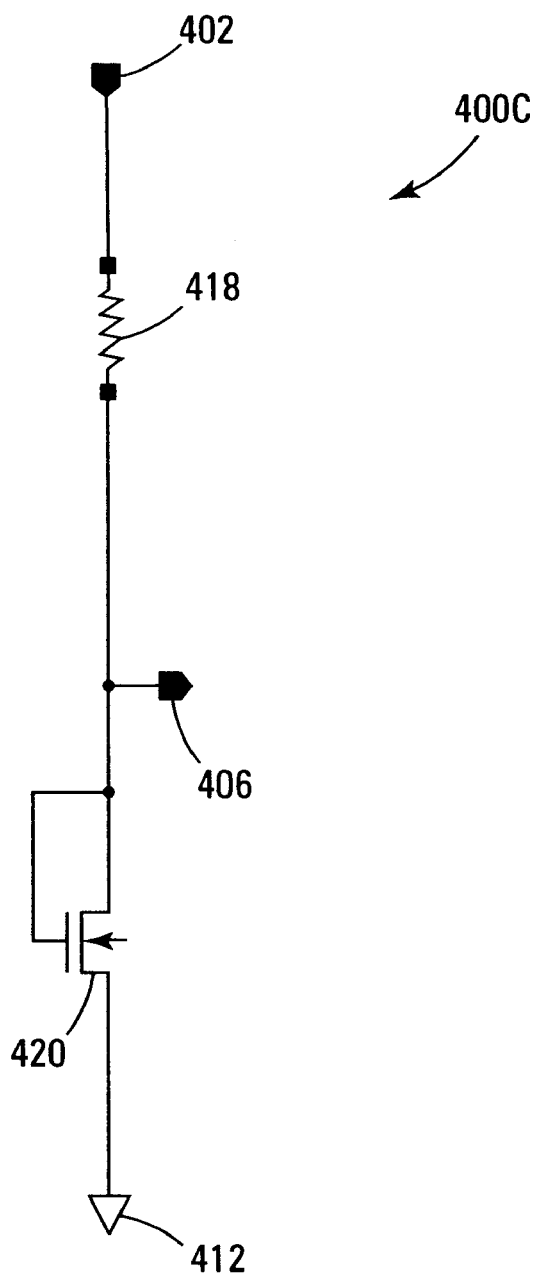
FIG. 4C is a schematic of a temperature-dependent voltage generator in accordance with still another embodiment of the invention.

FIG. 4C is a schematic of a temperature-dependent voltage generator 400C in accordance with still another embodiment of the invention exhibiting a direct proportionality between the ambient temperature and its output. The temperature-dependent voltage generator 400C is coupled to receive the second reference voltage at node 402. A resistive element 418 is coupled in series with an nFET 420 between the node 402 and a ground node 412. The nFET 420 has its gate coupled to its drain. The output node 406 is coupled to the drain of the nFET 420.

Figure 4D:
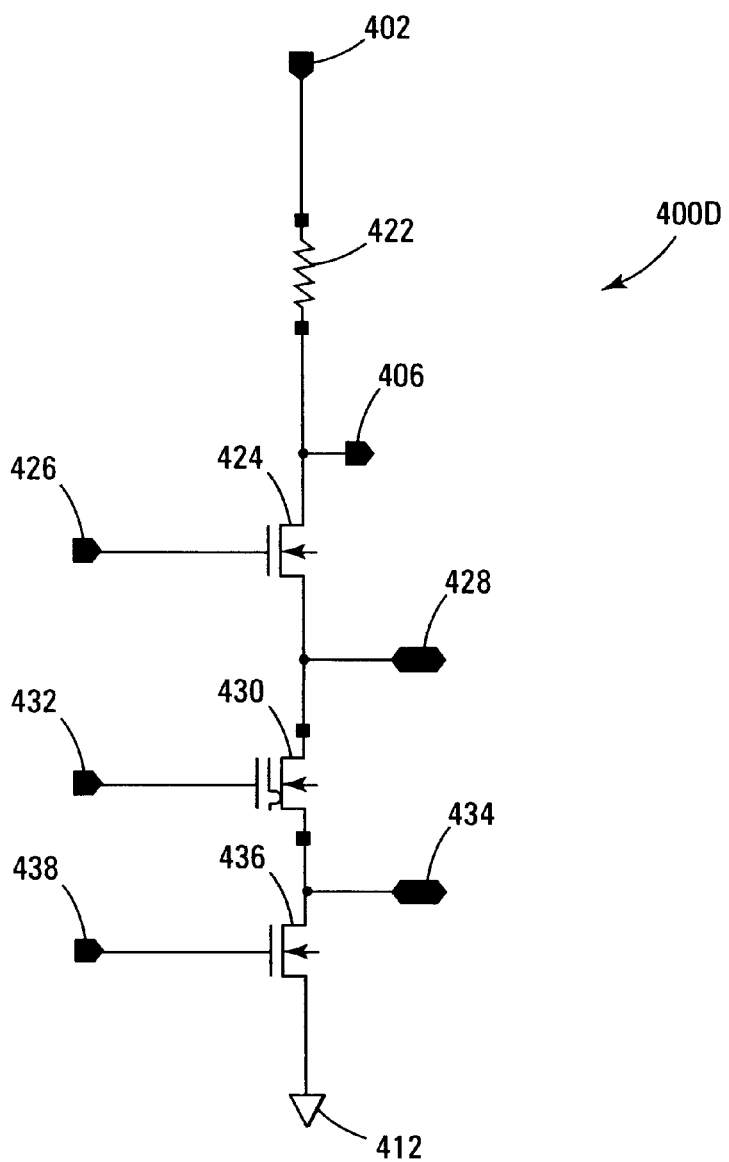
FIG. 4D is a schematic of a temperature-dependent voltage generator in accordance with yet another embodiment of the invention.

FIG. 4D is a schematic of a temperature-dependent voltage generator 400D in accordance with yet another embodiment of the invention. While the characteristics of the temperature-dependent voltage generators depicted in FIGS. 4A–4C are generally fixed at the time of fabrication, it is possible to make the characteristics user-programable such that the transition point of the comparison between a reference voltage and a temperature-dependent voltage signal can be shifted after fabrication. The embodiment of FIG. 4D accomplishes this by providing a programmable temperature-sensitive element.

The temperature-dependent voltage generator 400D is coupled to receive the second reference voltage at node 402. A resistive element 422 is coupled between the node 402 and the drain of an nFET 424. The output node 406 is coupled to the drain of the nFET 424.

The programmable temperature-sensitive element is a floating-gate FET 430. As is well known, the threshold voltage of the floating-gate FET 430 can be adjusted by adding or removing charge from its floating gate. This, in turn, affects the conductance of the element, thus altering the characteristics of the temperature-dependent voltage generator 400D. The floating-gate FET 430 has its drain coupled to the source of the nFET 424 and its source coupled to the drain of an nFET 436. The nFET 436 has its source coupled to the ground node 412.

The nFETs 424 and 436 act as isolation devices during the programming of the floating-gate FET 430. By applying a logic low value to the gates of the nFETs 424 and 436 through the nodes 426 and 438, respectively, the floating-gate FET 430 can be isolated. By then varying the gate, source and drain voltages applied to the isolated floating-gate FET 430 at nodes 432, 434 and 428, respectively, the threshold voltage of the floating-gate FET 430 can be altered.

Figure 5:
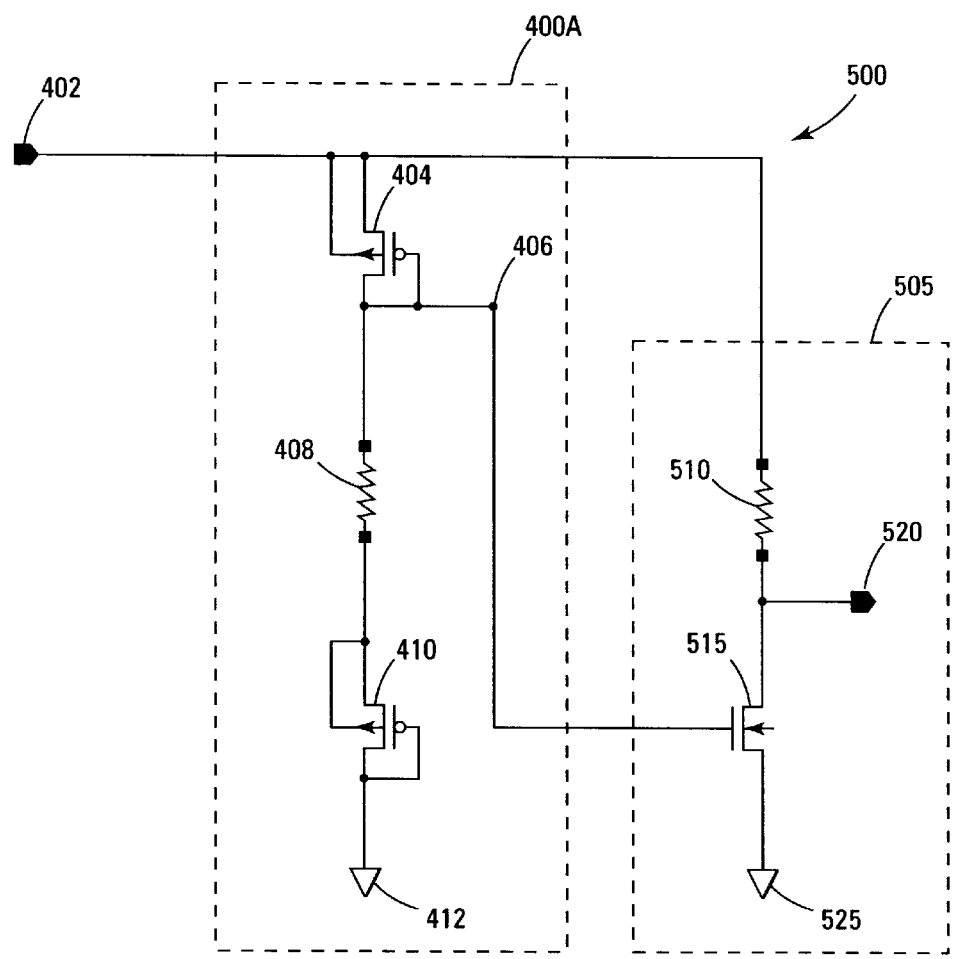
FIG. 5 is a schematic of an amplified temperature-dependent voltage generator in accordance with an embodiment of the invention.

To increase the sensitivity of the temperature-dependent voltage signal, the output of a temperature-dependent voltage generator may be amplified. This increases the gain or slope of the temperature-dependent voltage signal, thus facilitating finer tuning of the transition point for the comparison between the temperature-dependent voltage signal and the first reference voltage. FIG. 5 is a schematic of an amplified temperature-dependent voltage generator 500 in accordance with one embodiment of the invention. The amplified temperature-dependent voltage generator 500 is based on the temperature-dependent voltage generator 4A of FIG. 4A. However, the output of other temperature-dependent voltage generators may be similarly amplified.

The amplified temperature-dependent voltage generator 500 includes an amplification stage 505 coupled to a temperature-dependent voltage generator 400A. The amplification stage 505 includes a resistive element 510 coupled between the node 402 and an output node 520. An nFET 515 is coupled in series with the resistive element 510 between the node 402 and a ground node 525. The gate of the nFET 515 is coupled to receive the output of the temperature-dependent voltage generator 400A at node 406. The temperature-dependent voltage signal at node 520 is used for comparison with the first reference voltage and represents a gain-adjusted value of the output of the temperature-dependent voltage generator 400A.

Figure 6:
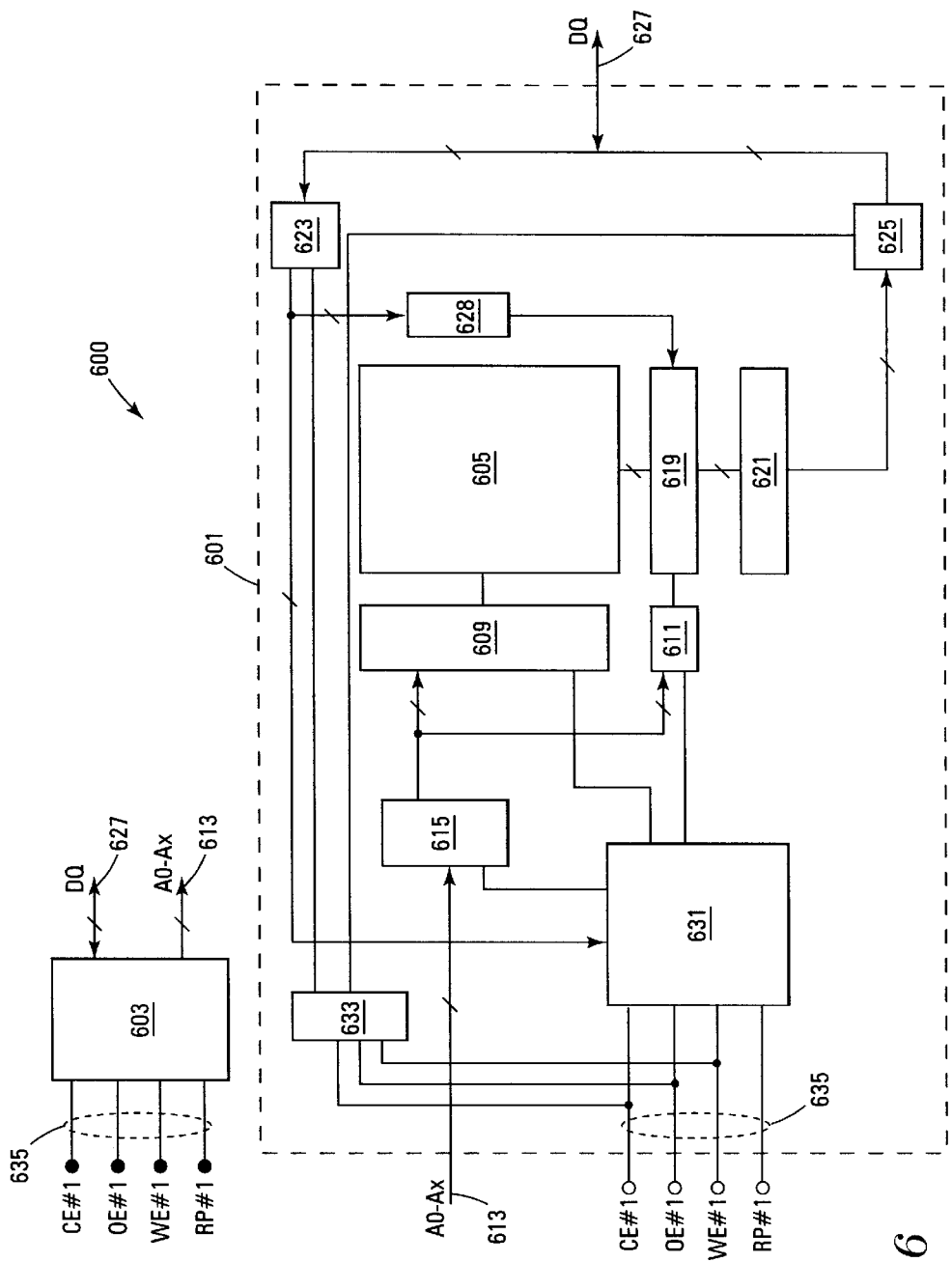
FIG. 6 is a functional block diagram of a basic flash memory device that is coupled to a processor in accordance with an embodiment of the invention.

FIG. 6 is a functional block diagram of a basic flash memory device 601 that is coupled to a processor 603. The memory device 601 and the processor 603 may form part of an electronic system 600. The memory device 601 has been simplified to focus on features of the memory that are helpful in understanding the present invention. The memory device 601 includes an array of memory cells 605.

The memory cells may be non-volatile floating-gate memory cells arranged in rows and columns, with the rows often arranged in blocks. A memory block is some discrete portion of the memory array 605. The memory cells generally can be erased in blocks. Data, however, may be stored in the memory array 605 separate from the block structure.

A row decoder 609 and a column decoder 611 are provided to decode address signals provided on address lines A0-Ax 613. An address buffer circuit 615 is provided to latch the address signals. Address signals are received and decoded to access the memory array 605. Column select circuitry 619 is provided to select one or more columns of the memory array 605 in response to control signals from the column decoder 611. Sensing circuitry 621 is used to sense and amplify data stored in the memory cells. Data input 623 and output 625 buffers are included for bi-directional data communication over a plurality of data (DQ) lines 627 with the processor 603. The DQ lines 627 provide access to data values of memory cells of the memory array 605. A data latch 629 is typically provided between data input buffer 623 and the memory array 605 for storing data values (to be written to a memory cell) received from the DQ lines 627. Data amplified by the sensing circuitry 621 is provided to the data output buffer 625 for output on the DQ lines 627. The data output buffer 625 includes at least one temperature-compensated output buffer circuit in accordance with an embodiment of the invention.

Command control circuit 631 decodes signals provided on control lines 635 from the processor 603. These signals are used to control the operations on the memory array 605, including data read, data write, and erase operations. Input/output control circuit 633 is used to control the data input buffer circuit 623 and the data output buffer circuit 625 in response to some of the control signals. As stated above, the flash memory device 601 has been simplified to facilitate a basic understanding of the features of the memory. A more detailed understanding of flash memories is known to those skilled in the art. As is well known, such memory devices 601 may be fabricated as integrated circuits on a semiconductor substrate. Furthermore, while the example has been shown with relation to a flash memory device

CONCLUSION

The various embodiments facilitate adding current drive capacity to an output buffer in response to increases in ambient temperature. Current drive capacity is added by selectively activating additional buffer stages in parallel with a primary buffer stage when the ambient temperature exceeds one or more predetermined temperatures. Thus, the output buffer maintains its integrity and speed during changes in ambient temperature.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. An output buffer circuit, comprising:
   a first output buffer stage for providing an output signal indicative of a logic of a data signal; and
   at least one second output buffer stage, wherein each second output buffer stage is adapted to selectively generate, in response to a temperature-dependent control signal, an output signal indicative of the logic of the data signal in parallel with the output signal of the first output buffer stage.

2. The output buffer circuit of claim 1, further comprising:
   a temperature-dependent voltage generator for generating a temperature-dependent voltage signal; and
   a comparator for generating the temperature-dependent control signal in response to a comparison of the temperature-dependent voltage signal to a reference voltage.

3. The output buffer circuit of claim 1, wherein each second output buffer stage is adapted to be placed in a high-impedance state when it is not providing its output signal indicative of the logic of the data signal.

4. The output buffer circuit of claim 1, wherein each second output buffer stage is adapted to generate its output signal indicative of the logic of the data signal when an ambient temperature exceeds a predetermined value.

5. The output buffer circuit of claim 4, wherein each second output buffer stage is associated with its own predetermined ambient temperature value.

6. An output buffer circuit, comprising:
   a first output buffer stage for providing an output signal indicative of a logic of a data signal; and
   at least one second output buffer stage selectively activated in response to a temperature-dependent control signal;
   wherein each second output buffer stage is adapted to provide an output signal indicative of the logic of the data signal in parallel with the output signal of the first output buffer stage when activated; and
   wherein each second output buffer stage is adapted to present a high-impedance state when deactivated.

7. The output buffer circuit of claim 6, further comprising:
   a temperature-dependent voltage generator for generating a voltage signal as a function of ambient temperature; and
   a comparator for generating the temperature-dependent control signal having a first logic level when the temperature-dependent voltage signal indicates that the ambient temperature is less than a predetermined threshold and having a second logic level when the temperature-dependent voltage signal indicates that the ambient temperature is equal to or greater than the predetermined threshold.

8. The output buffer circuit of claim 7, wherein the predetermined threshold is programmable after fabrication of the output buffer circuit.

9. An output buffer circuit, comprising:
   an output driver for providing two control signals representative of a data signal;
   a first output buffer stage for providing an output signal indicative of the data signal in response to the two output driver control signals;
   at least one switch responsive to a temperature-dependent control signal, wherein each switch is adapted to pass the two output driver control signals when the temperature-dependent control signal has a first logic value and to pass two complementary control signals when the temperature-dependent control signal has a second logic value;
   at least one second output buffer stage in parallel with the first output buffer stage, each second output buffer stage coupled to one of the switches in a one-to-one relationship for receiving its output control signals, wherein each second output buffer stage is adapted to provide an output signal indicative of the data signal when the temperature-dependent control signal has the first logic value and to present a high-impedance state when the temperature-dependent control signal has the second logic value.

10. The output buffer circuit of claim 9, further comprising:
    a comparator having a first input for receiving a reference voltage and a second input for receiving a temperature-dependent voltage signal, wherein the comparator is adapted for generating the temperature-dependent control signal in response to a comparison of the temperature-dependent voltage signal and the reference voltage; and
    a temperature-dependent voltage generator coupled to the second input for generating the temperature-dependent voltage signal as a function of an ambient temperature.

11. The output buffer circuit of claim 10, wherein the temperature-dependent voltage generator comprises:
- a first pFET having a source, drain, gate and body, wherein its source and body are coupled to a first node for receiving a second reference voltage and its gate is coupled to its drain;
- a second pFET having a source, drain, gate and body, wherein its body is coupled to its source and its gate and drain are coupled to a second node for receiving a ground potential;
- a resistive element coupled between the drain of the first pFET and the source of the second pFET; and
- an output node coupled between the drain of the first pFET and the second input of the comparator.

12. The output buffer circuit of claim 11, further comprising an amplifier stage coupled between the output node of the temperature-dependent voltage generator and the second input of the comparator.

13. The output buffer circuit of claim 12, wherein the amplifier stage further comprises:
- a resistive element coupled between the first node of the temperature-dependent voltage generator and the second input of the comparator; and
- an nFET having a source, a drain and a gate, wherein its drain is coupled to the second input of the comparator, its source is coupled to a third node for receiving the ground potential and its gate is coupled to the output node of the temperature-dependent voltage generator.

14. The output buffer circuit of claim 10, wherein the temperature-dependent voltage generator comprises:
- an output node coupled to the second input of the comparator;
- a pFET having a source, drain and gate, wherein its gate and drain are coupled to the output node and its source is coupled to a node for receiving a second reference voltage; and
- a resistive element coupled between the output node and a node for receiving a ground potential.

15. The output buffer circuit of claim 14, further comprising an amplifier stage coupled between the output node of the temperature-dependent voltage generator and the second input of the comparator.

16. The output buffer circuit of claim 10, wherein the temperature-dependent voltage generator comprises:
- an output node coupled to the second input of the comparator;
- a resistive element coupled between the output node and a node for receiving a second reference voltage;
- an nFET having a source, drain and gate, wherein its gate and drain are coupled to the output node and its source is coupled to a node for receiving a ground potential.

17. The output buffer circuit of claim 16, further comprising an amplifier stage coupled between the output node of the temperature-dependent voltage generator and the second input of the comparator.

18. The output buffer circuit of claim 10, wherein the temperature-dependent voltage generator is programmable.

19. The output buffer circuit of claim 18, wherein the temperature-dependent voltage generator comprises a programmable temperature-sensitive element.

20. The output buffer circuit of claim 19, wherein the programmable temperature-sensitive element is a floating-gate FET.

21. The output buffer circuit of claim 10, wherein the temperature-dependent voltage generator comprises:
- an output node coupled to the second input of the comparator;
- a resistive element coupled between the output node and a node for receiving a second reference voltage;
- a first nFET having a source, drain and gate, wherein its drain coupled to the output node;
- a floating-gate FET having a source, drain, gate and floating gate, wherein its drain is coupled to the source of the first nFET; and
- a second nFET having a source, drain and gate, wherein its drain is coupled to the source of the floating-gate FET and its source is coupled to a node for receiving a ground potential;
- wherein the source, drain and gate of the floating-gate FET are coupled to receive programming voltages capable of adding and removing charge from its floating gate; and
- wherein the gates of the first and second nFETs are coupled to receive control signals for selectively deactivating the first and second nFETs while the programming voltages are applied to the floating-gate FET.

22. The output buffer circuit of claim 14, further comprising an amplifier stage coupled between the output node of the temperature-dependent voltage generator and the second input of the comparator.

23. An output buffer circuit, comprising:
- an output driver for providing two control signals representative of a data signal;
- a first output buffer stage for providing an output signal indicative of the data signal in response to the two output driver control signals;
- at least one switch responsive to a temperature-dependent control signal, wherein each switch is adapted to pass the two output driver control signals when the temperature-dependent control signal has a first logic value and to pass two complementary control signals when the temperature-dependent control signal has a second logic value;
- at least one second output buffer stage in parallel with the first output buffer stage, each second output buffer stage coupled to one of the switches in a one-to-one relationship for receiving its output control signals, wherein each second output buffer stage is adapted to provide an output signal indicative of the data signal when the temperature-dependent control signal has the first logic value and to present a high-impedance state when the temperature-dependent control signal has the second logic value;
- a temperature-dependent voltage generator for generating the temperature-dependent voltage signal as a function of an ambient temperature;
- a comparator having a first input for receiving a reference voltage and a second input for receiving the temperature-dependent voltage signal, wherein the comparator is adapted for generating the temperature-dependent control signal having the first logic level when the temperature-dependent voltage signal is indicative of an ambient temperature at or above a predetermined threshold and having the second logic level when the temperature-dependent voltage signal is indicative of an ambient temperature below the predetermined threshold.

24. A method of providing a data output signal, comprising:
- generating a first output signal at a first output buffer stage in response to a data signal;

selectively activating a second output buffer stage to generate a second output signal in response to the data signal when an ambient temperature is greater than or equal to a predetermined threshold; and adding the first output signal and the second output signal to generate the data output signal.

25. The method of claim 24, further comprising:

generating a first temperature-dependent voltage signal having a proportionality to the ambient temperature;

comparing the first temperature-dependent voltage signal to a reference voltage;

generating a first temperature-dependent control signal in response to the comparison of the first temperature-dependent voltage signal and the reference voltage; and selectively activating the second output buffer stage in response to the first temperature-dependent control signal.

26. The method of claim 25, further comprising:

amplifying the first temperature-dependent voltage signal prior to comparing it to the reference voltage.

27. The method of claim 25, wherein generating a first temperature-dependent control signal further comprises generating the first temperature-dependent control signal having a first logic level when the first temperature-dependent voltage signal is greater than the reference voltage and having a second logic level when the first temperature-dependent voltage signal is less than the reference voltage.

28. The method of claim 24, further comprising:

selectively activating a third output buffer stage to generate a third output signal in response to the data signal when the ambient temperature is greater than or equal to a second predetermined threshold that is greater than the first predetermined threshold; and adding the third output signal to the first and second output signals to generate the data output signal.

29. The method of claim 28, further comprising:

generating a second temperature-dependent voltage signal having a proportionality to the ambient temperature;

comparing the second temperature-dependent voltage signal to the reference voltage;

generating a second temperature-dependent control signal in response to the comparison of the second temperature-dependent voltage signal and the reference voltage; and selectively activating the third output buffer stage in response to the second temperature-dependent control signal.

30. The method of claim 29, further comprising:

amplifying the second temperature-dependent voltage signal prior to comparing it to the reference voltage.

31. The method of claim 29, wherein generating a second temperature-dependent control signal further comprises generating the second temperature-dependent control signal having the first logic level when the second temperature-dependent voltage signal is greater than the reference voltage and having the second logic level when the second temperature-dependent voltage signal is less than the reference voltage.

32. The method of claim 29, further comprising:

generating a second temperature-dependent voltage signal having a direct proportionality to the ambient temperature;

wherein the second temperature-dependent voltage signal is lower than the first temperature-dependent voltage signal at a given ambient temperature.

33. The method of claim 29, further comprising:

generating a second temperature-dependent voltage signal having an inverse proportionality to the ambient temperature;

wherein the second temperature-dependent voltage signal is greater than the first temperature-dependent voltage signal at a given ambient temperature.

34. A memory device, comprising:

an array of memory cells;

a plurality of data lines for access to the memory cells; and an output buffer coupled between the array of memory cells and the plurality of data lines, wherein the output buffer includes at least one output buffer circuit, comprising:

a first output buffer stage for providing an output signal indicative of a logic of a data signal to one of the data lines, wherein the data signal is indicative of a data value of one of the memory cells;

at least one second output buffer stage, wherein each second output buffer stage is adapted to selectively generate, in response to a temperature-dependent control signal, an output signal indicative of the logic of the data signal for providing to the same data line as the output signal of the first output buffer stage.

35. The memory device of claim 34, wherein the output buffer circuit further comprises:

a temperature-dependent voltage generator for generating a temperature-dependent voltage signal; and a comparator for generating the temperature-dependent control signal in response to a comparison of the temperature-dependent voltage signal to a reference voltage.

36. The memory device of claim 34, wherein each second output buffer stage is adapted to be placed in a high-impedance state when it is not providing its output signal indicative of the logic of the data signal.

37. The output buffer circuit of claim 34, wherein each second output buffer stage is adapted to generate its output signal indicative of the logic of the data signal when an ambient temperature exceeds a predetermined value.

38. The output buffer circuit of claim 37, wherein each second output buffer stage is associated with its own predetermined ambient temperature value.

39. A memory device, comprising:

an array of memory cells;

a plurality of data lines for access to the memory cells; and an output buffer coupled between the array of memory cells and the plurality of data lines, wherein the output buffer includes at least one output buffer circuit, comprising:

a first output buffer stage for providing an output signal indicative of a logic of a data signal to a first one of the, data lines; and at least one second output buffer stage selectively activated in response to a temperature-dependent control signal;

wherein each second output buffer stage is adapted to provide an output signal indicative of the logic of the data signal to the first one of the data lines when activated; and wherein each second output buffer stage is adapted to present a high-impedance state to the first one of the data lines when deactivated.

40. The memory device of claim 39, wherein the output buffer circuit further comprises:
- a temperature-dependent voltage generator for generating a voltage signal as a function of ambient temperature; and
- a comparator for generating the temperature-dependent control signal having a first logic level when the temperature-dependent voltage signal indicates that the ambient temperature is less than a predetermined threshold and having a second logic level when the temperature-dependent voltage signal indicates that the ambient temperature is equal to or greater than the predetermined threshold.

41. A memory device, comprising:
- an array of memory cells;
- a plurality of data lines for access to the memory cells; and
- an output buffer coupled between the array of memory cells and the plurality of data lines, wherein the output buffer includes at least one output buffer circuit, comprising:
  - an output driver for providing two control signals representative of a data value of a memory cell;
  - a first output buffer stage for providing an output signal on a first one of the data lines, wherein the output signal is indicative of the data value of the memory cell;
  - at least one switch responsive to a temperature-dependent control signal, wherein each switch is adapted to pass the two output driver control signals when the temperature-dependent control signal has a first logic value and to pass two complementary control signals when the temperature-dependent control signal has a second logic value;
  - at least one second output buffer stage having an output coupled to the first one of the data lines, each second output buffer stage coupled to one of the switches in a one-to-one relationship for receiving its output control signals, wherein each second output buffer stage is adapted to provide an output signal on its output indicative of the data value of the memory cell when the temperature-dependent control signal has the first logic value and to present a high-impedance state on its output when the temperature-dependent control signal has the second logic value.

42. The memory device of claim 41, wherein the output buffer circuit further comprises:
- a comparator having a first input for receiving a reference voltage and a second input for receiving a temperature-dependent voltage signal, wherein the comparator is adapted for generating the temperature-dependent control signal in response to a comparison of the temperature-dependent voltage signal and the reference voltage; and
- a temperature-dependent voltage generator coupled to the second input for generating the temperature-dependent voltage signal as a function of an ambient temperature.

43. A memory device, comprising:
- an array of memory cells;
- a plurality of data lines for access to the memory cells; and
- an output buffer coupled between the array of memory cells and the plurality of data lines, wherein the output buffer includes at least one output buffer circuit, comprising:
  - an output driver for providing two control signals representative of a data value of a memory cell;
  - a first output buffer stage for providing an output signal to a first one of the data lines in response to the two output driver control signals, wherein the output signal is indicative of the data value of the memory cell;
  - at least one switch responsive to a temperature-dependent control signal, wherein each switch is adapted to pass the two output driver control signals when the temperature-dependent control signal has a first logic value and to pass two complementary control signals when the temperature-dependent control signal has a second logic value;
  - at least one second output buffer stage, each second output buffer stage having an output coupled to the first one of the data lines and an input coupled to receive the output control signals of one of the switches, wherein each second output buffer stage is adapted to provide an output signal to the first one of the data lines that is indicative of the data value of the memory cell when the temperature-dependent control signal has the first logic value and to present a high-impedance state to the first one of the data lines when the temperature-dependent control signal has the second logic value;
  - a temperature-dependent voltage generator for generating the temperature-dependent voltage signal as a function of an ambient temperature;
  - a comparator having a first input for receiving a reference voltage and a second input for receiving the temperature-dependent voltage signal, wherein the comparator is adapted for generating the temperature-dependent control signal having the first logic level when the temperature-dependent voltage signal is indicative of an ambient temperature above a predetermined threshold and having the second logic level when the temperature-dependent voltage signal is indicative of an ambient temperature below the predetermined threshold.

44. The memory device of claim 43, wherein the comparator is further adapted for generating the temperature-dependent control signal having the first logic level when the temperature-dependent voltage signal is indicative of an ambient temperature at the predetermined threshold.

* * * * *